US012598921B2

(12) United States Patent
Kim et al.

(10) Patent No.: US 12,598,921 B2
(45) Date of Patent: Apr. 7, 2026

(54) THIN FILM HAVING SINGLE-CRYSTAL-LEVEL CRYSTAL ORIENTATION PROPERTY, METHOD FOR MANUFACTURING SAME, AND PRODUCT USING SAME

(71) Applicant: KOREA ELECTROTECHNOLOGY RESEARCH INSTITUTE, Changwon-si (KR)

(72) Inventors: Ho Sup Kim, Gimhae-si (KR); Sang Soo Oh, Gimhae-si (KR); Hong Soo Ha, Changwon-si (KR); Jeong Hyeon Jo, Changwon-si (KR); Gwan Tae Kim, Gimhae-si (KR); Hyun Woo Noh, Changwon-si (KR)

(73) Assignee: KOREA ELECTROTECHNOLOGY RESEARCH INSTITUTE (KR)

( * ) Notice: Subject to any disclaimer, the term of this patent is extended or adjusted under 35 U.S.C. 154(b) by 1356 days.

(21) Appl. No.: 17/245,192

(22) Filed: Apr. 30, 2021

(65) Prior Publication Data

US 2021/0265554 A1 Aug. 26, 2021

Related U.S. Application Data

(63) Continuation of application No. PCT/KR2019/014492, filed on Oct. 30, 2019.

(30) Foreign Application Priority Data

| Nov. 2, 2018 | (KR) | .......................... 10-2018-0133927 |
| Nov. 7, 2018 | (KR) | .......................... 10-2018-0135829 |
| Oct. 15, 2019 | (KR) | .......................... 10-2019-0127641 |

(51) Int. Cl.
*H10N 60/01* (2023.01)
*H10N 60/83* (2023.01)
(Continued)

(52) U.S. Cl.
CPC ......... *H10N 60/0576* (2023.02); *H10N 60/83* (2023.02); *H10N 60/85* (2023.02); *C23C 14/16* (2013.01); *C23C 14/24* (2013.01)

(58) Field of Classification Search
CPC .................................................. H10N 60/0576
See application file for complete search history.

(56) References Cited

U.S. PATENT DOCUMENTS

| 6,563,132 B1 * | 5/2003 | Talroze | ................ H10N 60/851 257/E39.007 |
| 7,220,315 B2 | 5/2007 | Ijima | |

(Continued)

FOREIGN PATENT DOCUMENTS

| JP | 05254994 A | 10/1993 |
| JP | 07037822 A | 2/1995 |

(Continued)

OTHER PUBLICATIONS

International Search Report (PCT/KR2019/014492), WIPO, Feb. 12, 2020.

*Primary Examiner* — Paul A Wartalowicz
(74) *Attorney, Agent, or Firm* — Park & Associates IP Law Office

(57) ABSTRACT

Proposed are a thin film having an excellent crystal orientation property, a method of manufacturing the same, and a semiconductor device, a battery device, a superconducting wire, and a superconducting article including the thin film. The technical gist of the present disclosure includes a thin film having a single-crystal-level crystal orientation property, which is formed by depositing a polycrystalline second material on an upper portion of a substrate including a polycrystalline first material and which has a crystal orientation property satisfying the following Relational Expression 1 at a grain boundary, a method of manufacturing the (Continued)

same, and a semiconductor device, a battery device, a superconducting wire, and a superconducting article including the thin film.

$$0° < FWHM_2 \leq 3°$$ [Relational Expression 1]

(FWHM$_2$ is a full width at half maximum of a distribution curve of a misorientation angle at the grain boundary of the thin film).

8 Claims, 15 Drawing Sheets

(51) Int. Cl.
  _H10N 60/85_     (2023.01)
  _C23C 14/16_     (2006.01)
  _C23C 14/24_     (2006.01)

(56)                References Cited

U.S. PATENT DOCUMENTS

2012/0238454 A1*  9/2012  Yoshizumi ......... H10N 60/0632
                                                             427/595
2017/0133576 A1*  5/2017  Marcus ................ C23C 14/225

FOREIGN PATENT DOCUMENTS

JP          2014077166 A     5/2014
KR     10-2010-0004098 A     1/2010

* cited by examiner (a)

(b)

(c)

THIN FILM HAVING SINGLE-CRYSTAL-LEVEL CRYSTAL ORIENTATION PROPERTY, METHOD FOR MANUFACTURING SAME, AND PRODUCT USING SAME

REFERENCE TO RELATED APPLICATIONS

This is a continuation of pending International Patent Application PCT/KR2019/014492 filed on Oct. 30, 2019, which designates the United States and claims priority of Korean Patent Application No. 10-2018-0133927 filed on Nov. 2, 2018, and Korean Patent Application No. 10-2018-0135829 filed on Nov. 7, 2018, and Korean Patent Application No. 10-2019-0127641 filed on Oct. 15, 2019, the entire contents of which are incorporated herein by reference.

FIELD OF THE INVENTION

The present disclosure relates to a thin film having single crystallinity and an excellent crystal orientation property, a method of manufacturing the same, and a semiconductor device, a battery device, a superconducting wire, and a superconducting article including the thin film having single crystallinity.

BACKGROUND OF THE INVENTION

A grain boundary means an interface formed when the growth surfaces of adjacent crystals come into contact with each other during the growth of the crystals having different crystal directions. A polycrystalline thin film has a problem that hinders utilization of the material's intrinsic properties due to incomplete bonding occurring at such grain boundaries. Accordingly, an expensive single crystal substrate is used to form a single crystalline thin film.

In this regard, the single crystallinity or surface flatness of the thin film deposited on the substrate may improve various properties of the thin film. Therefore, in order to overcome the problem of defects in the crystal structure, studies are being conducted to form a thin film of a single crystal or a single-crystal-level thin film.

However, in most cases, the thin film is formed on substrates having different lattice constants, so that it is difficult to achieve the growth into a thin film having single crystallinity. Moreover, when a thin film having single crystallinity is directly grown on heterogeneous substrates with inconsistent lattices at high temperatures, due to the mismatch of lattices, the strain occurring at the interface between the substrate and the thin film layer (epilayer) is increased together with the growth, and eventually, a defect occurs together with relaxation when the strain exceeds a critical value. Therefore, there is a problem in that the quality of the thin film layer is deteriorated.

Further, in the case of a superconducting wire including a metal substrate, a buffer layer, and a superconducting layer, the crystal orientation property of the superconducting layer directly affects the superconducting properties thereof. As shown in FIG. 1, the misorientation angle 30 at the grain boundary 10 of the buffer layer is reflected to even the superconducting layer, which affects the crystal orientation of the superconducting layer. From this, it can be seen that the crystal orientation property is deteriorated as the misorientation angle is increased and, conversely, the crystal orientation property is improved as the misorientation angle is reduced.

However, since a single crystalline metal substrate has the drawbacks of being difficult to manufacture in a large area and high costs, in some cases, an IBAD (Ion Beam Assisted Deposition, U.S. Pat. No. 7,531,205 B2) substrate or RABiTS (Rolling Assisted Biaxially Textured Substrate, U.S. Pat. No. 6,455,166 B1) may be used as a metal substrate.

However, although the IBAD and RABiTS metal substrates have an excellent crystal orientation property among polycrystalline materials, there is a limitation in crystal orientation property compared to single crystals, so the IBAD and RABiTS metal substrates have a problem in that the misorientation angle thereof is 6° or higher on average. Thus, new technology development and research are urgently required to overcome this problem.

SUMMARY OF THE INVENTION

Accordingly, the present disclosure has been made keeping in mind the above problems occurring in the prior art, and an objective of the present disclosure is to provide a thin film having single crystallinity and an excellent crystal orientation property, a method of manufacturing the same, and a semiconductor device, a battery device, a superconducting wire, and a superconducting article including the same.

In order to accomplish the above objective, the present disclosure provides a thin film having single crystallinity, which is formed by depositing a polycrystalline second material on an upper portion of a substrate including a polycrystalline first material and which has a crystal orientation property satisfying the following Relational Expression 1 at a grain boundary.

$$0°<FWHM_2 \le 3° \qquad \text{[Relational Expression 1]}$$

($FWHM_2$ is a full width at half maximum of a distribution curve of a misorientation angle at the grain boundary of the thin film)

Further, in the present disclosure, a size of a crystal grain formed by depositing the second material in the thin film is at least two times as large as a size of a crystal grain of the substrate.

Further, in the present disclosure, the second material is Fe, a Fe alloy, or a Fe-based compound.

Further, in the present disclosure, a crystal orientation property of the substrate and the crystal orientation property of the thin film satisfy the following Relational Expression 2.

$$5°<FWHM_1-FWHM_2 \le 20° \qquad \text{[Relational Expression 2]}$$

($FWHM_1$ and $FWHM_2$ are a full width at half maximum of a distribution curve of a misorientation angle at a grain boundary of the substrate and at the grain boundary of the thin film, respectively)

Further, in the present disclosure, the first material is a crystalline solid including a single element or a compound containing the single element.

In order to accomplish the above objective, the present disclosure also provides a method of manufacturing a thin film having single crystallinity. The method includes preparing a substrate including a polycrystalline first material, and forming the thin film by depositing a polycrystalline second material on an upper portion of the substrate. The forming the thin film includes performing depositing so that crystals having a size lager than a size of crystal grains of the substrate are formed and crystal orientation is performed in parallel with an average direction of orientation axes of the crystal grains of the substrate, thus forming the thin film having an excellent crystal orientation property of crystal grains.

In order to accomplish the above objective, the present disclosure also provides a semiconductor device including the above-described thin film having single crystallinity.

In order to accomplish the above objective, the present disclosure also provides a battery device including the above-described thin film having single crystallinity.

In order to accomplish the above objective, the present disclosure also provides a superconducting wire including a substrate, a thin film layer which is formed by depositing the thin film according to any one of claims 1 to 5 on an upper portion of the substrate, and a superconducting layer formed on an upper portion of the thin film layer.

In order to accomplish the above objective, the present disclosure also provides a superconducting article including the above-described superconducting wire.

In a thin film having single crystallinity of the present disclosure by the means for overcoming the above problems, deposition is performed so that crystal orientation is achieved in parallel with the average direction of the orientation axes of the crystal grains of a substrate, thus ensuring the excellent crystal orientation properties of the crystal grains.

Further, it is possible to provide a semiconductor device, a battery device such as a thin film solar battery, a superconducting wire, and a superconducting article which includes the thin film having single crystallinity of the present disclosure formed by performing deposition so that crystal orientation is performed in parallel with the directions of orientation axes, thus ensuring the excellent crystal orientation properties of crystal grains.

That is, a polycrystalline second material having the excellent crystal orientation property at a grain boundary is deposited on an upper portion of a substrate including a polycrystalline first material to form the thin film. Accordingly, the thin film is applicable to a variety of functional thin films that require a single-crystal-level substrate having a large area in the semiconductor device, the battery device, the superconducting wire, and the superconducting article. Further, since it is possible to perform mass production using a reel to reel method at low costs, there is an effect of replacing high-priced Si and Ge wafers that are fragile.

Further, according to the manufacturing method of the present disclosure, a crystal having a size that is larger than the size of the crystal grain of the substrate is formed, and the deposition is performed so that crystal orientation is achieved in parallel with the average direction of the orientation axes of the substrate, thereby forming the thin film having the excellent crystal orientation properties of crystal grains. Accordingly, it is possible to easily form a thin film having single crystallinity.

DETAILED DESCRIPTION OF THE INVENTION

Hereinafter, a preferable embodiment of the present disclosure will be described in detail with reference to the accompanying drawings.

However, the degree of orientation of a crystal described in the present specification refers to a degree of coincidence of the directions of the orientation axes of crystal grains in a polycrystal, and the crystal grains refer to individual crystals in the polycrystal.

An aspect of the present disclosure relates to a thin film having single crystallinity, which is formed by depositing a polycrystalline second material on an upper portion of a substrate including a polycrystalline first material and which has a crystal orientation property satisfying the following Relational Expression 1 at a grain boundary.

$$0° < FWHM_2 \le 3°  \qquad \text{[Relational Expression 1]}$$

($FWHM_2$ is a full width at half maximum of a distribution curve of a misorientation angle at the grain boundary of the thin film).

Figure 1:
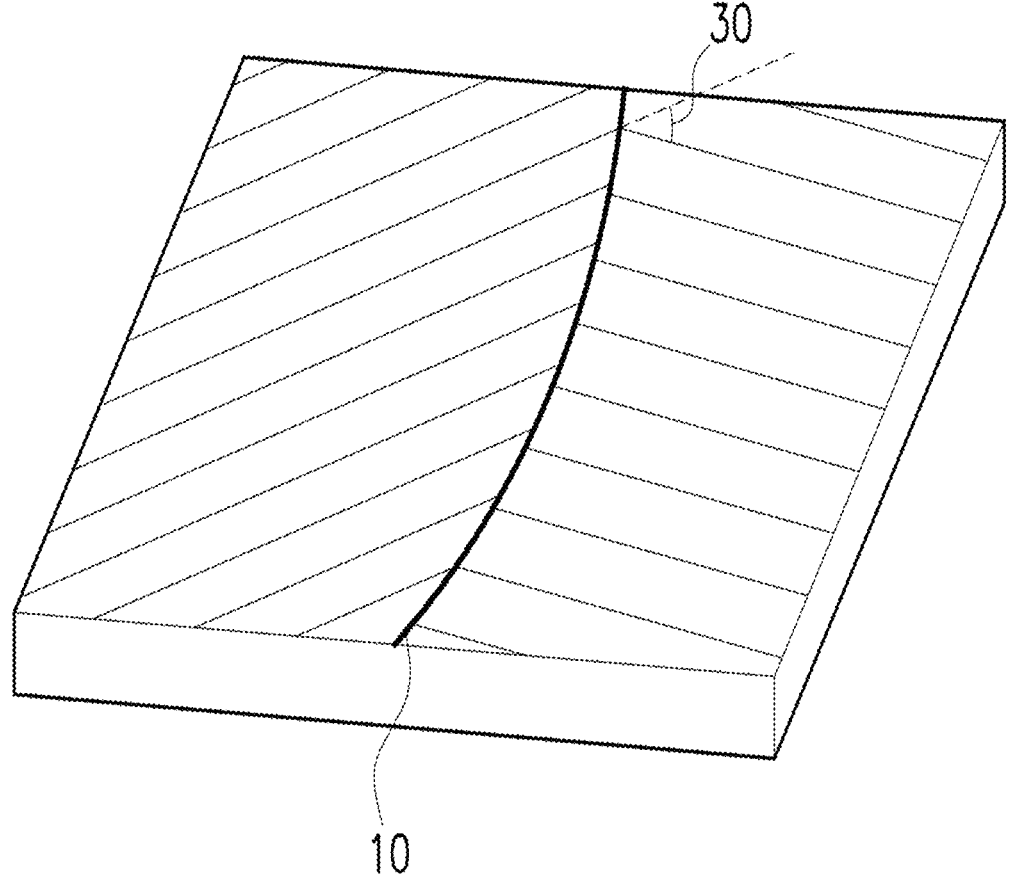
FIG. 1 is an explanatory view showing a grain boundary and a misorientation angle.
Figure 2:
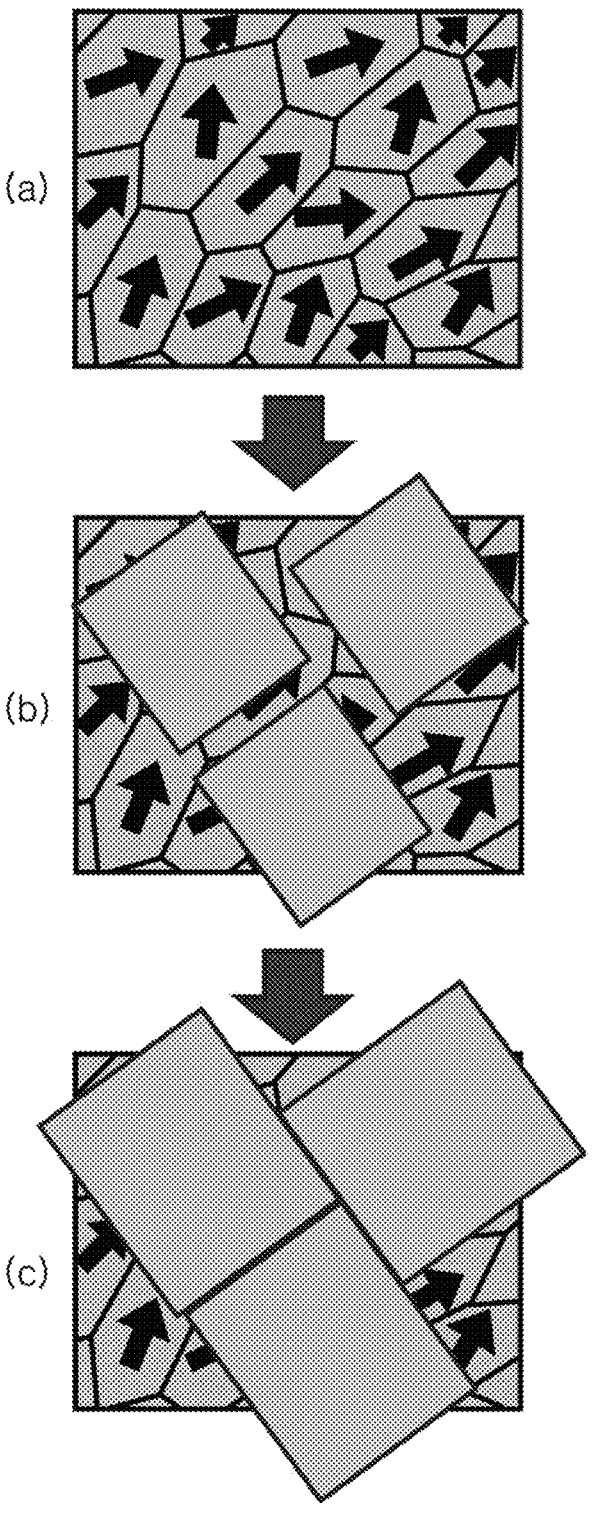
FIG. 2 shows a mechanism for forming a thin film having single crystallinity of the present disclosure.

FIG. 2 shows a mechanism for forming the thin film having single crystallinity. Referring to this, the polycrystalline second material is deposited on the upper portion of the substrate including the polycrystalline first material to form the thin film. A crystal nucleus having a size that is larger than the size of the crystal grain of the substrate is formed during the deposition, and the crystal is grown to achieve the deposition of the thin film. In the substrate including the polycrystalline first material, the directions of the orientation axes of the crystal grains constituting the substrate may be randomly set (FIG. 2(*a*)). On the other hand, when the polycrystalline second material is deposited on the substrate, the deposition is performed while the crystal nucleus is rapidly formed and grown on the substrate, and the crystal nucleus is formed so as to have a size larger than the grain size at the grain boundary of the substrate. When the directions of the orientation axes of the crystal grains of the thin film coincide with the average direction of the orientation axes of the crystal grains of the substrate, since the energy is the lowest, the deposition may be performed so that the directions are parallel to the average direction of the orientation axes of the substrate (FIG. 2(b)). Preferably, the size of the crystal grain formed by depositing the second material may be at least two times as large as the size of the crystal grain of the substrate. More preferably, when the size is five to six times as large as the size of the crystal grain of the substrate, the average direction of the orientation axes of the crystal grains of the substrate may almost coincide with the orientation directions of the crystal grains of the thin film. Subsequently, when the crystal nucleus is grown and the thin film deposition is achieved as the deposition of the second material continues, the crystal orientation property of crystal grain of thin film indicates the single crystallinity satisfying that the full width at half maximum of the misorientation angle at the grain boundary is 3 or less (FIG. 2(c)).

In this regard, FIG. 3 shows a FeCo thin film which is a thin film having single crystallinity according to a preferable embodiment of the present disclosure. In particular, FIG. 3A shows an SEM photograph of the surface of the thin film of a FeCo alloy. Referring to this, in the FeCo thin film, FeCo crystals have a rectangular shape and the orientation axes thereof are straight and uniformly aligned. This means that crystal nuclei are formed in a single-crystal-level orientation state and the crystals are epitaxially grown to form the thin film. That is, even when the polycrystalline thin film of the FeCo alloy is formed on the substrate including the polycrystalline first material, the average direction of the orientation axes of the crystal grains of the substrate coincide with the alignment direction. Accordingly, the FeCo thin film is deposited parallel to the average orientation axis of the substrate and the alignment direction, thereby forming a single crystalline FeCo thin film.

Figure 3A:
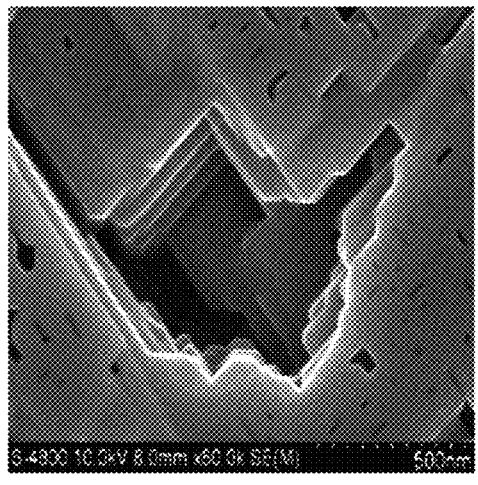
FIGS. 3A to 3D show a FeCo thin film which is a thin film having single crystallinity according to a preferable embodiment of the present disclosure.
Figure 3B:
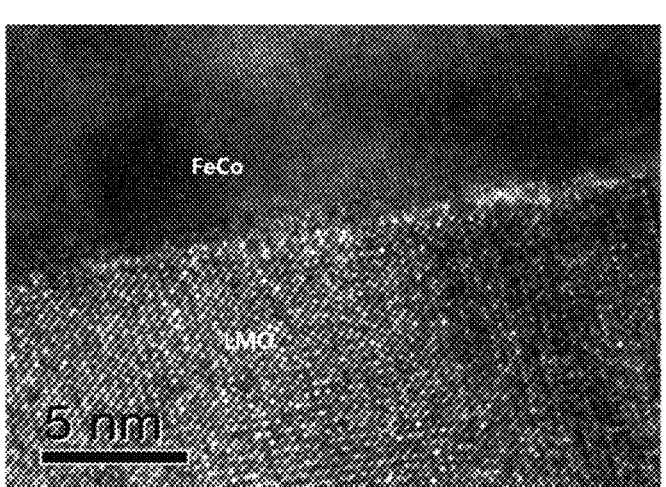
Figure 3C:
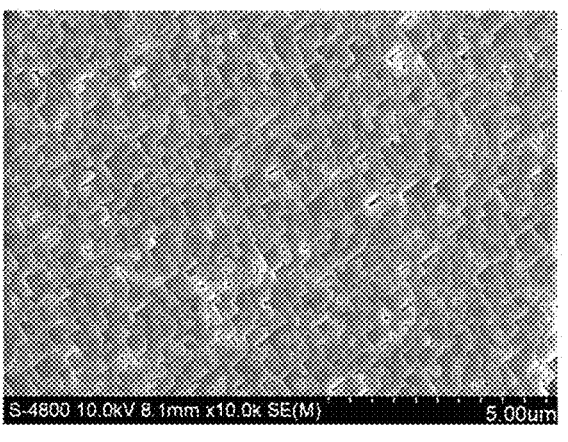
Figure 3D:
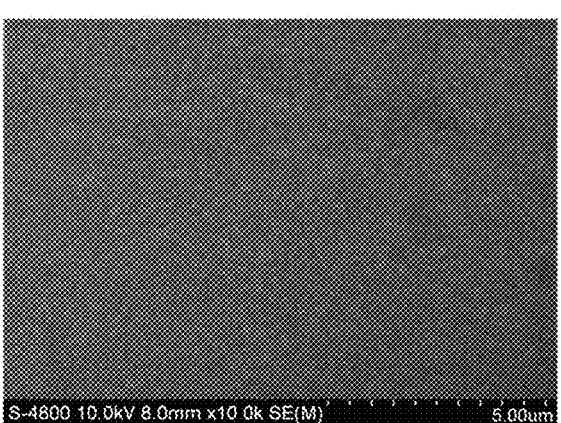

Further, FIG. 3B shows a TEM photograph of the cross section of a thin film of a FeCo alloy. Referring to this, FIG. 3B simply shows that crystals are epitaxially grown from the interface between a LMO layer and the thin film of the FeCo alloy. Further, FIG. 3C shows a SEM photograph of the surface of the thin film of the FeCo alloy having a thickness of 400 nm or less formed by performing the deposition using a thermal evaporation deposition method at a temperature of 600° C. or higher. The FeCo crystals of the thin film of the FeCo alloy have a square shape and are well aligned in a straight line. Further, FIG. 3D shows a SEM photograph of the surface of the thin film of the FeCo alloy having a thickness of 400 nm or more formed by performing the deposition using a thermal evaporation deposition method at a temperature of 400 to 600° C. The FeCo crystals of the thin film of the FeCo alloy are combined so as to have a flat surface.

Therefore, in the thin film having single crystallinity of the present disclosure, as described above, when the second material is deposited, the crystal nuclei are formed and the crystals are epitaxially grown to form the thin film. Accordingly, the crystal orientation property of the thin film is controlled in a lowest energy state when the crystal nuclei are formed. Therefore, the single-crystal-level crystal orientation property is ensured almost at the same time as the second material is deposited. Preferably, in the case of the thin film having single crystallinity of the present disclosure, the deposition is performed so that crystal orientation is achieved in parallel with the average direction of the orientation axes of the crystal grains of the substrate in an area ranging from the interface with the substrate including the first material to a depth of tens of nm. Since the thin film is formed by deposition while the crystals are epitaxially grown, a thin film having single crystallinity and a thickness ranging from several hundred nm to several m may be formed. More preferably, the thin film having single crystallinity of the present disclosure exhibits the single crystallinity satisfying Relational Expression 1 in an area ranging from the interface with the substrate formed on a lower portion of the thin film to a depth of 40 nm or less.

Further, in the present disclosure, the polycrystalline second material for forming the thin film may be Fe, a Fe alloy, or a Fe-based compound. The thin film including the Fe-based second material has a body-centered cubic (bcc) structure. Accordingly, the deposition may be performed so that the crystal nucleus located at the center of each crystal is oriented parallel to the average direction of the alignment axes of the crystal grains of the substrate. Further, Fe is the second most common metal in the earth's crust after aluminum and has the highest specific gravity among the elements constituting the earth. Therefore, the Fe-based thin film having single crystallinity serves to improve economic feasibility in terms of production costs and is excellent in crystal orientation property. The Fe-based thin film having single crystallinity may exhibit an excellent crystal orientation property regardless of the type of the first substrate including the polycrystalline first material, and thus is applicable to a flexible substrate and a large-area substrate.

Preferably, the Fe-based thin film may be a thin film including an alloy of Fe and Co and/or Ni. More preferably, the Fe-based thin film may be $Fe_xCo_{1-x}(0 \leq x \leq 0.5)$ or $FeNi_3$.

Figure 4A:
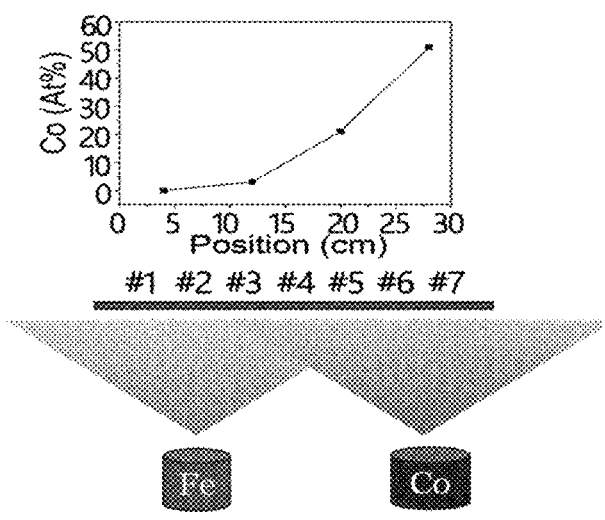
FIGS. 4A and 4B are graphs showing the analysis of 2-theta according to the composition ratio of a thin film including a $Fe_xCo_{1-x}$ alloy according to an embodiment of the present disclosure.
Figure 4B:
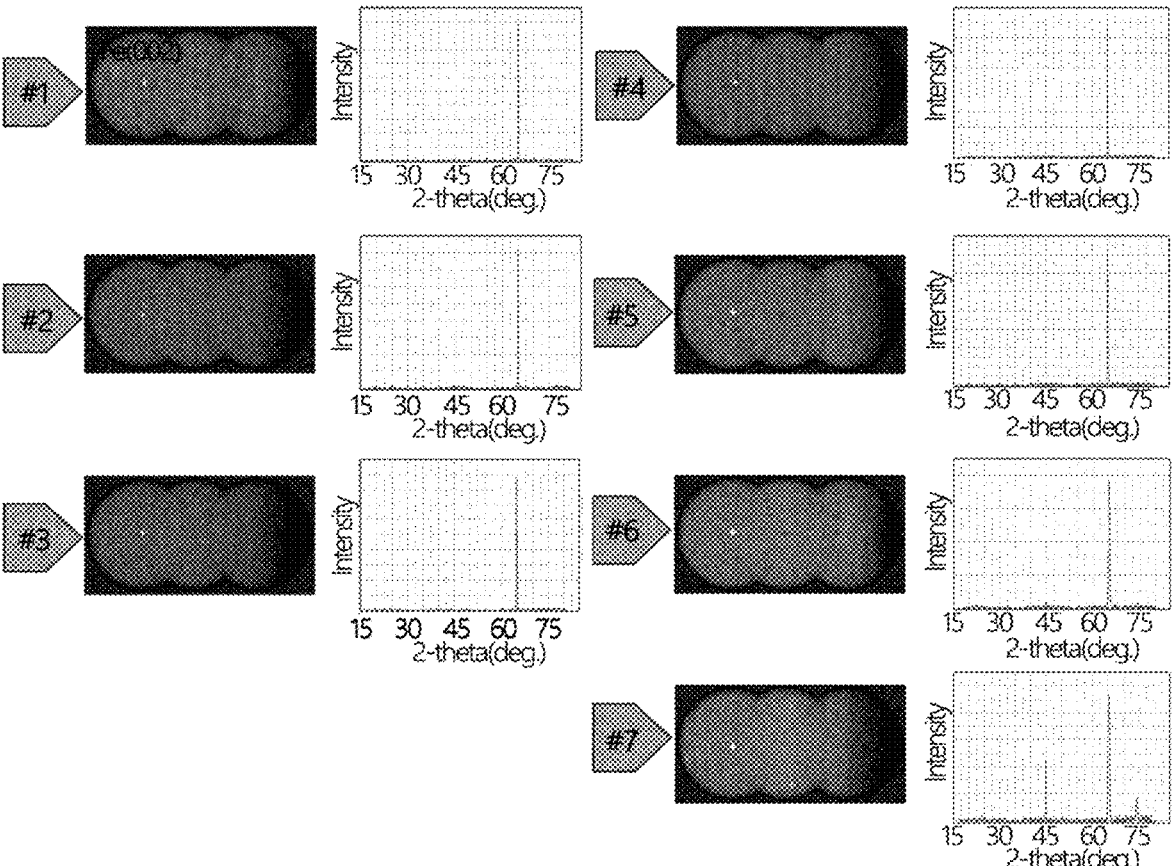

Further, FIGS. 4A and 4B are graphs showing the analysis of 2-theta according to the composition ratio of a thin film including a $Fe_xCo_{1-x}$ alloy according to a preferable embodiment of the present disclosure. With respect to the deposition portions of iron and cobalt for measuring the crystal orientation property of the FeCo thin film, the value approaching #1 means a high composition ratio of iron, and the value approaching #7 means a high composition ratio of cobalt. Referring to this, even when the composition ratios of iron and cobalt are different from each other, the degree of alignment of the crystals in a plane direction is maintained. These results mean that crystal orientation is well maintained without sensitivity to the composition ratios of iron and cobalt while the crystal orientation is not significantly changed depending on the change of the composition ratio, so the $Fe_xCo_{1-x}$ thin film in film is capable of being commercialized as a thin film having single crystallinity.

Figure 5A:
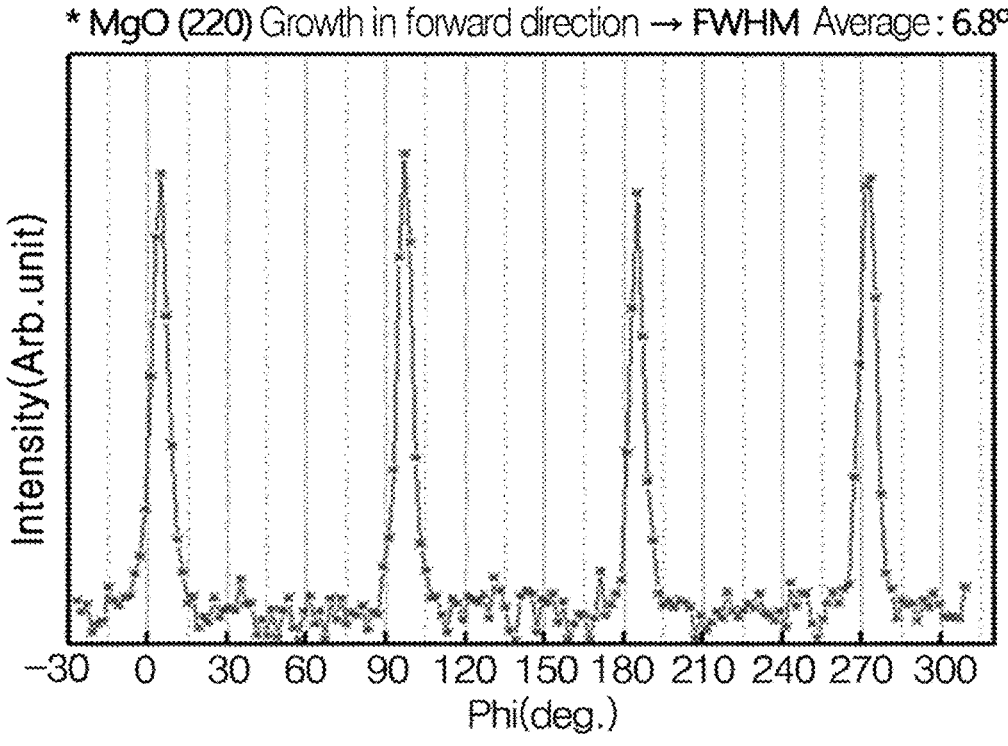
FIGS. 5A and 5B show the degree of alignment of crystals in a plane direction obtained by applying MgO and LMO as a first material according to an embodiment of the present disclosure and analyzing Phi Scan.
Figure 5A:
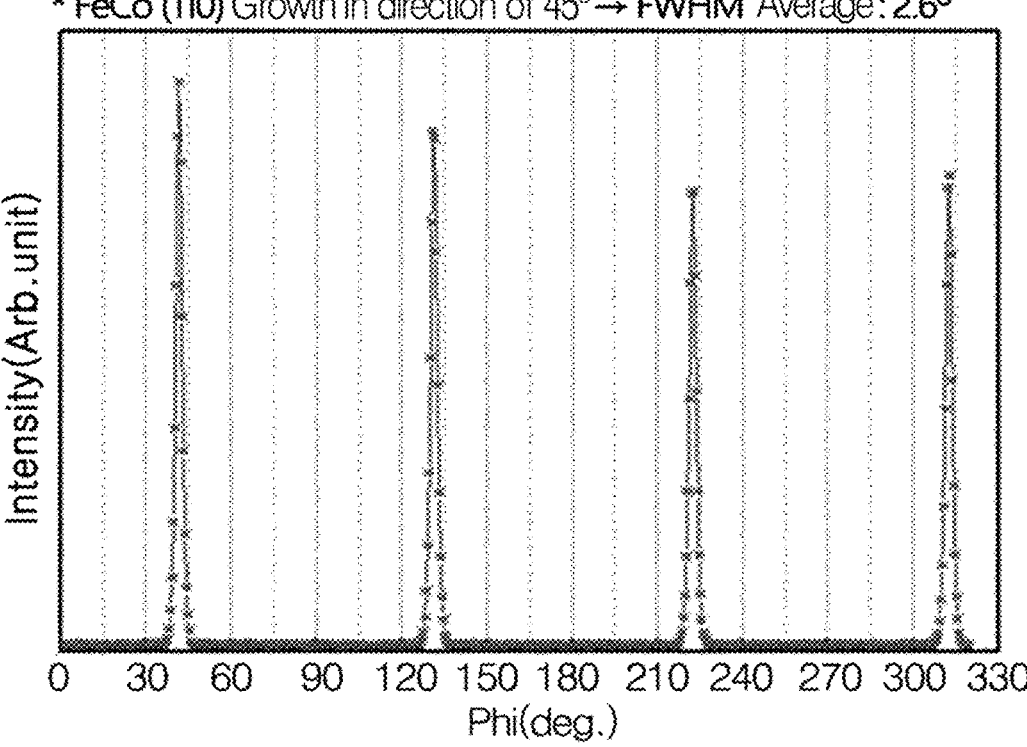
Figure 5B:
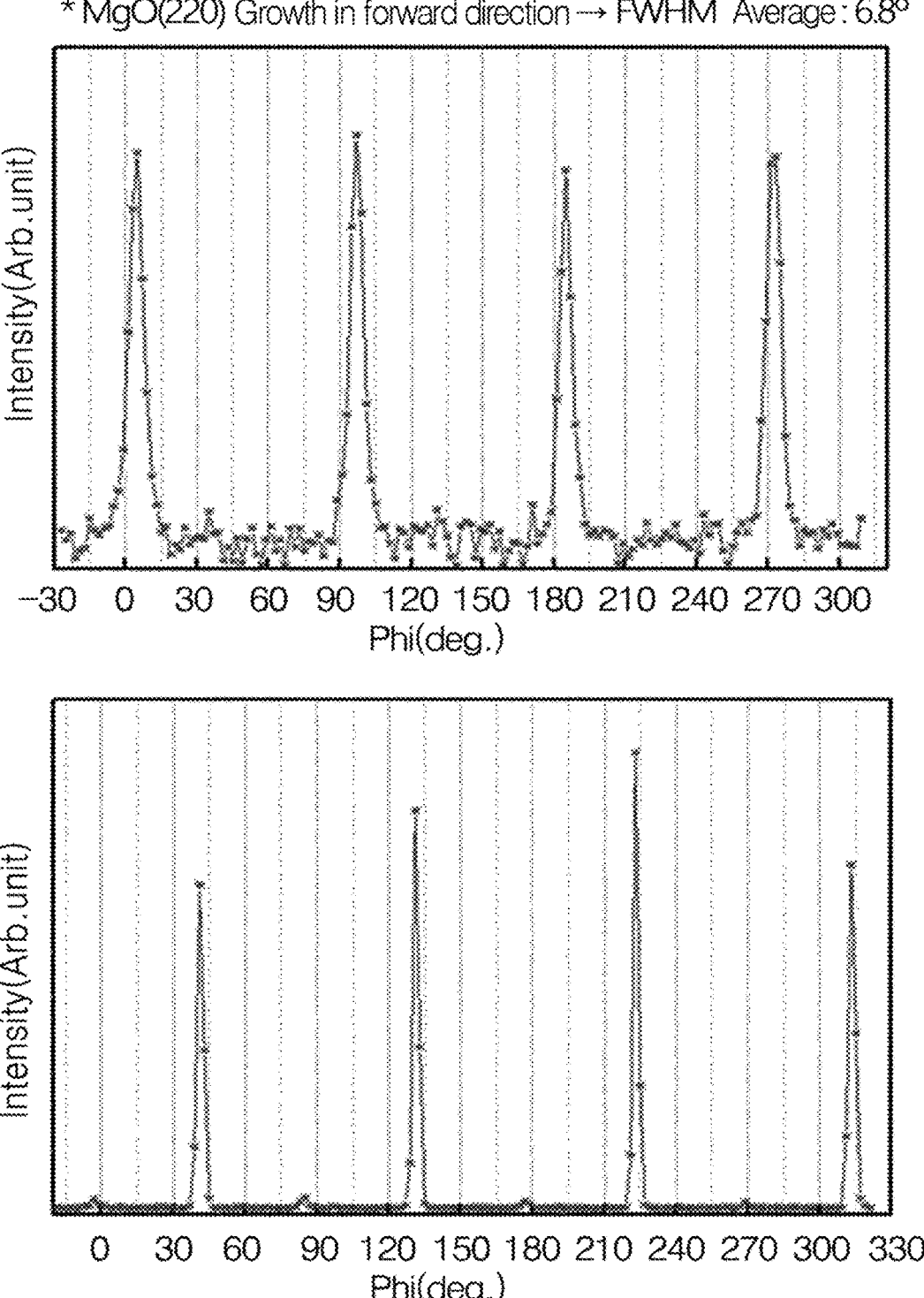

Further, FIG. 5 shows a crystal orientation ability according to the type of a first material according to a preferable embodiment of the present disclosure, and also shows the degree of alignment of crystals in a plane direction obtained by applying MgO and LMO as the first material and analyzing Phi Scan (in the Phi Scan, when viewing the plane at an angle of 360°, four peaks should be shown in the cube texture, and the sharper each peak, the better the alignment). Referring to this, through the peaks at 0°, 90°, 180°, and 270°, it is found that the average of the full width at half maximum of the substrate of the first material including MgO(220) grown in a forward direction is 6.8°. Through the peaks at 45°, 135°, 225°, and 315°, it is found that the average of the full width at half maximum of the thin film including the second material including a FeCo(110) alloy grown in a direction of 45° is 2.6° (FIG. 5A). Through the peaks at 0°, 90°, 180°, and 270°, it is found that the average of the full width at half maximum of the substrate of the first material including LMO(110) grown in a forward direction is 6.8°. Through the peaks at 45°, 135°, 225°, and 315°, it is found that the average of the full width at half maximum of the thin film including the second material including a FeCo(110) alloy grown in a direction of 45° is 2.9° (FIG. 5B). That is, the FeCo(110) thin film deposited regardless of the type of the first material exhibits the full width at half maximum of 3° or less. Accordingly, it can be confirmed that similar single crystalline orientation properties are ensured even when the types of the first materials are different from each other.

Further, FIG. 6 shows the crystal orientation ability according to the full width at half maximum of the misorientation angle of the crystal grains of a first material according to a preferable embodiment of the present disclosure at a grain boundary. Phi Scan analysis is performed while MgO(220) is applied as the first material and FeCo (110) is applied as the second material in the same manner as the above, but only the full width at half maximum of MgO(220) of the first material is changed, thus exhibiting the crystal orientation ability.

Figure 6A:
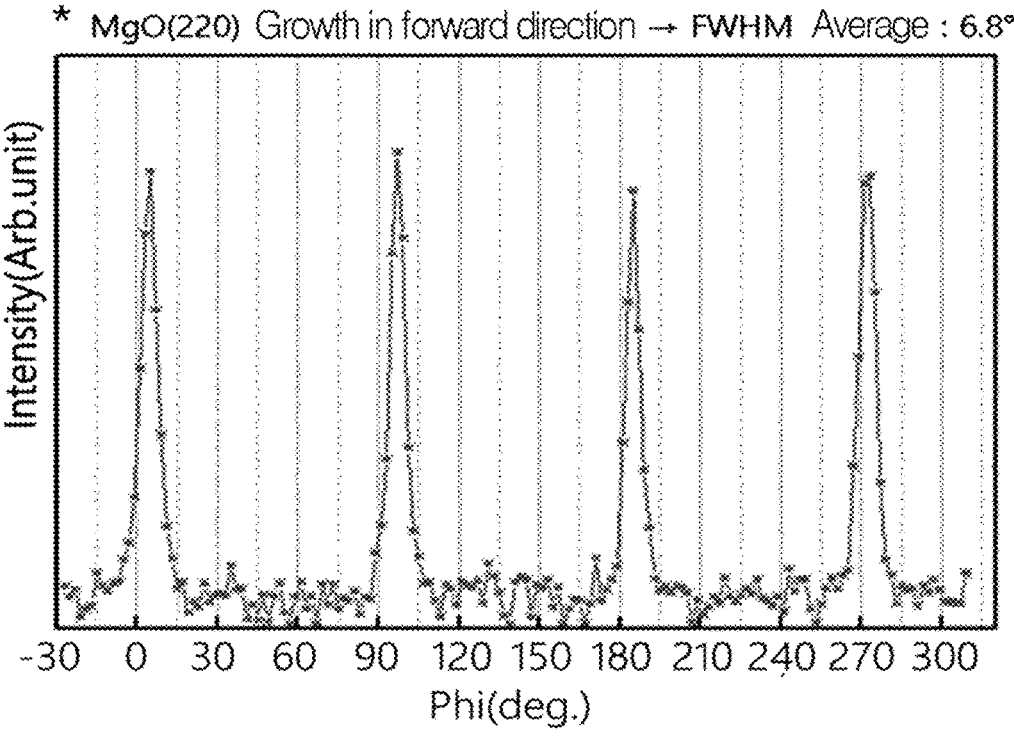
FIGS. 6A and 6B show the crystal orientation ability according to the full width at half maximum of the misorientation angle of the crystal grains of a first material according to an embodiment of the present disclosure at a grain boundary.
Figure 6A:
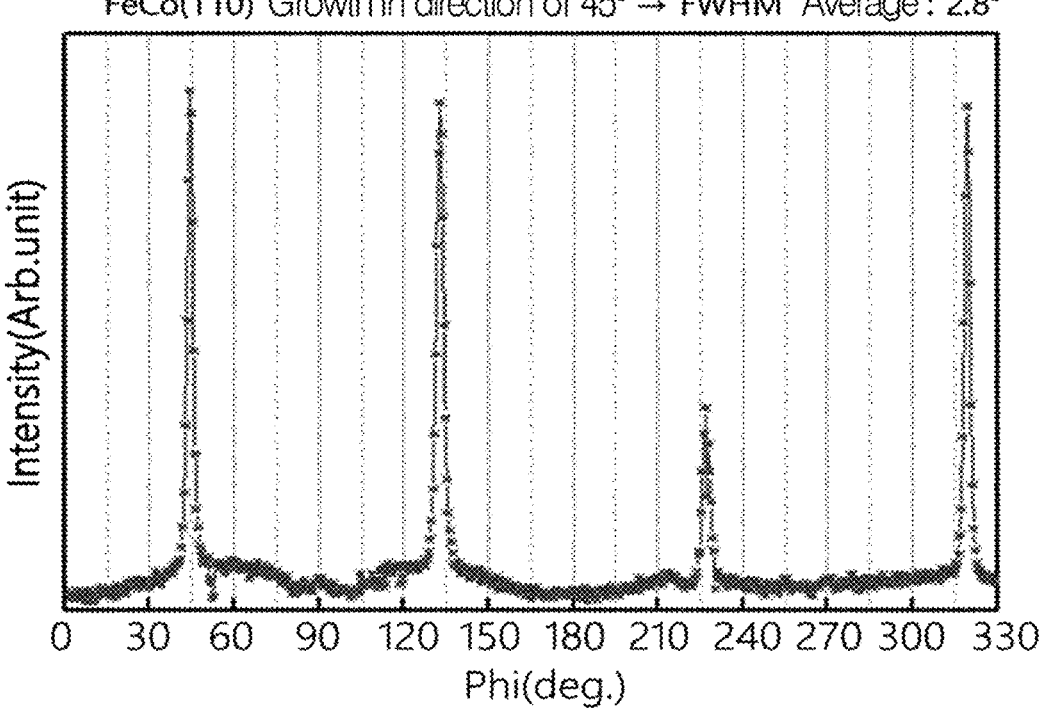
Figure 6B:
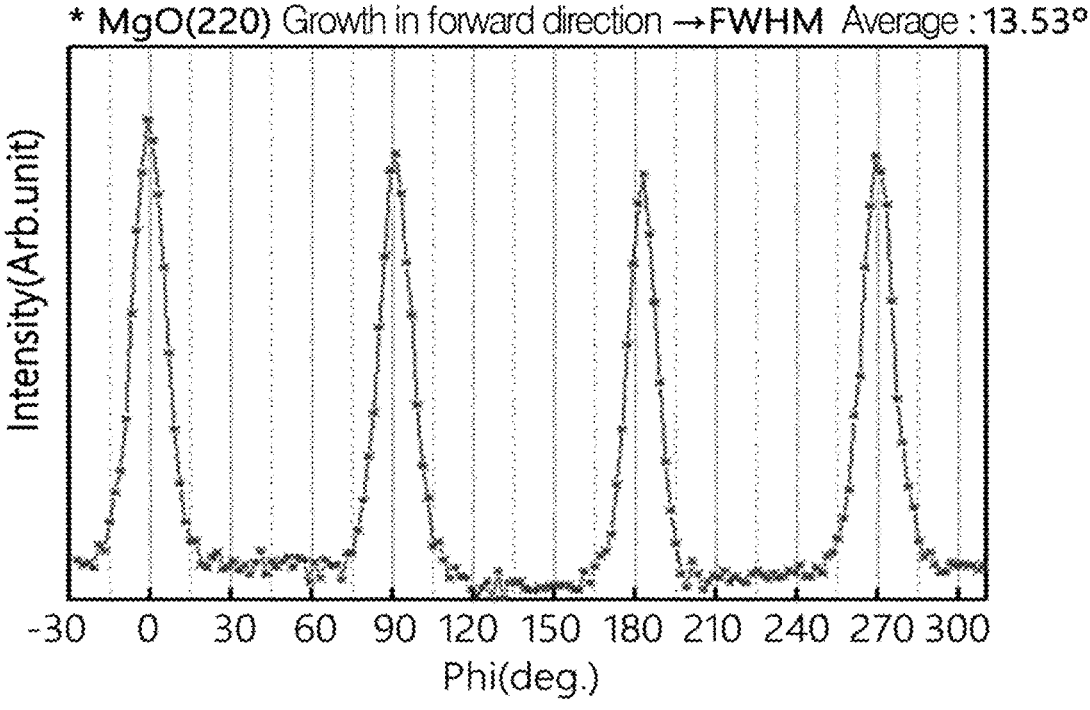
Figure 6B:
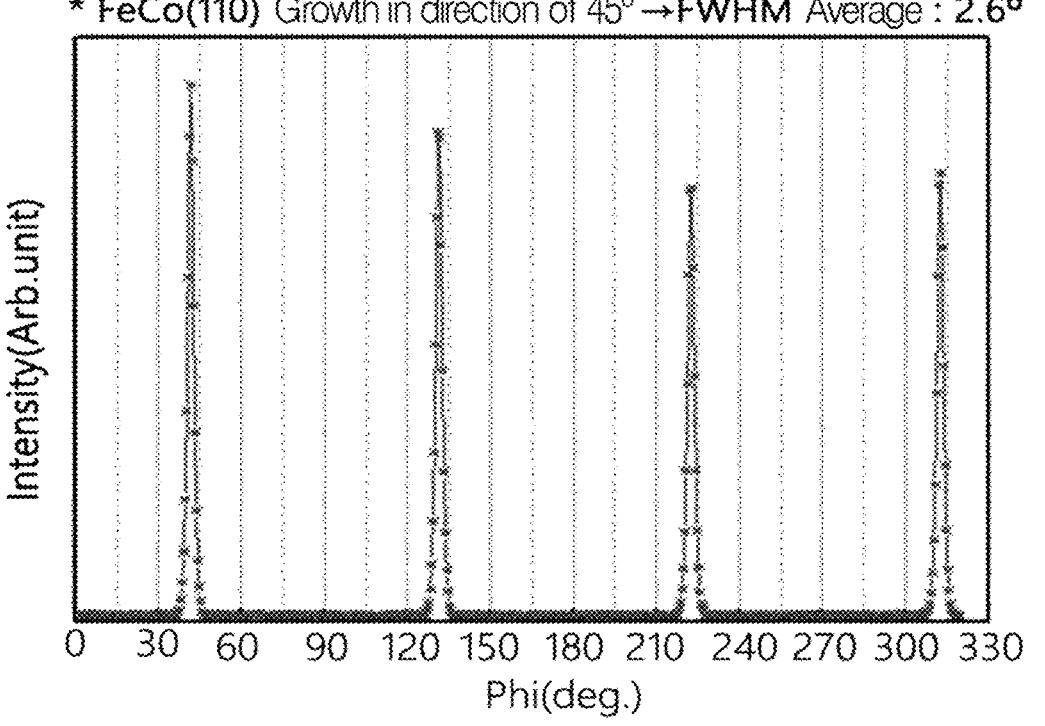

Referring to this, in FIG. 6A, through the peaks at 0°, 90°, 180°, and 270°, it is found that the average of the full width at half maximum of the substrate of the first material including MgO(220) grown in a forward direction is 6.8°, and through the peaks at 45°, 135°, 225°, and 315°, it is found that the average of the full width at half maximum of the thin film including the second material including a FeCo(110) alloy grown in a direction of 45° is 2.8°. In FIG. 6B, through the peaks at 0°, 90°, 180°, and 270°, it is found that the average of the full width at half maximum of the substrate of the first material including LMO(220) grown in a forward direction is a whopping 13.53°, and through the peaks at 45°, 135°, 225°, and 315°, it is found that the average of the full width at half maximum of the thin film including the second material including a FeCo(110) alloy grown in a direction of 45° is 2.6°. From these results, it can be confirmed that even when the misorientation angle of the average orientation axis of the substrate including the first material is biased to 6.8° or 13.53°, since the overall average direction of the orientation axes of the crystal grains of the substrate is one direction, the FeCo(110) thin film is oriented at a single crystal level even when the crystal orientation ability of MgO(220) which is the first material is poor.

Therefore, in the present disclosure, crystal orientation of the polycrystalline second material is performed on the upper portion of the substrate including the polycrystalline first material, thus exhibiting the single crystallinity. Accordingly, in particular, in the thin film having single crystallinity of the present disclosure, the crystal orientation property of the substrate and the crystal orientation property of the thin film satisfy the following Relational Expression 2, and the crystal orientation property of the thin film satisfies $0° < FWHM_2 \leq 3°$.

$$5° < FWHM_1 - FWHM_2 \leq 20° \qquad \text{[Relational Expression 2]}$$

($FWHM_1$ and $FWHM_2$ are a full width at half maximum of a distribution curve of a misorientation angle at a grain boundary of the substrate and at the grain boundary of the thin film, respectively).

That is, the crystal grains are formed by depositing the second material for forming the thin film having single crystallinity so that the size of the crystal grain is at least two times as large as the size of the crystal grain of the substrate, thus forming the crystal nucleus, and the orientation is achieved as the crystals are grown. Accordingly, the full width at half maximum at the grain boundary of the substrate and the full width at half maximum of the thin film exhibiting the single crystallinity are significantly different from each other. In particular, as the deposition speed is increased, the thin film may be formed at a single crystal level while the crystal nucleus is rapidly grown, IBAD and RABiTS metal substrates applied to a superconducting body have an average misorientation angle of 6°, and the full width at half maximum of the misorientation angle at the grain boundary of a commonly used substrate is up to about 20°. Therefore, as described above, the crystal orientation properties of the substrate and the thin film may satisfy Relational Expression 2, and the crystal orientation property of the thin film may satisfy $0° < FWHM_2 \leq 30$.

Further, in the present disclosure, the substrate may include a polycrystalline first material, and the first material may be a crystalline solid. Preferably, the crystalline solid includes one single element or two or more elements.

The crystalline solid is a material in which a repetitive or periodic arrangement exists between atoms in a wide range. Through solidification, a regular three-dimensional pattern of atoms is formed and the atoms form a bond with the nearest atom. All metals, most ceramics, and some polymers form crystal structures under normal solidification conditions. Such a crystalline solid includes both a single crystal structure in which the entire crystals are regularly formed along a predetermined orientation axis and a polycrystalline structure that forms a set of small single crystals having different orientations.

More preferably, the first material is a polycrystalline solid having a grain size of several to tens of nm. The first material may be one or more of a metal, a metal oxide, a polymer, and a ceramic including one or two or more elements.

Examples of the metal may include one or more of copper, titanium, aluminum, steel, and stainless steel. In addition, one or more of IBAD (Ion Beam Assisted Deposition), RABiTS (Rolling Assisted Biaxially Textured Substrate), and Hastelloy are usable.

Further, in the case of the metal oxide, one or more of tin (Sn) oxide, antimony (Sb)-, niobium (Nb)-, or fluorine-doped tin (Sn) oxide, indium (In) oxide, tin-doped indium (In) oxide, zinc (Zn) oxide, aluminum (Al)-, boron (B)-, gallium (Ga)-, hydrogen (H)-, indium (In)-, yttrium (Y)-, titanium (Ti)-, silicon (Si)-, or tin (Sn)-doped zinc (Zn) oxide, magnesium (Mg) oxide, cadmium (Cd) oxide, magnesium zinc (MgZn) oxide, indium zinc (InZn) oxide, copper aluminum (CuAl) oxide, silver (Ag) oxide, gallium (Ga) oxide, zinc tin oxide (ZnSnO), titanium oxide (TiO2), zinc indium tin (ZIS) oxide, nickel (Ni) oxide, rhodium (Rh) oxide, ruthenium (Ru) oxide, iridium (Ir) oxide, copper (Cu) oxide, cobalt (Co) oxide, tungsten (W) oxide, and titanium (Ti) oxide may be selected to be used as the substrate.

Further, the polymer substrate is a flexible substrate. The polymer used may be one or more of polyimide (PI), polyamide (PA), polyamide-imide, polyester, polyurethane (PU), polyurethane acrylate (PUA), polyacrylamide (PA), polyethylene terephthalate (PET), polyether sulfone (PES), polyethylene naphthalate (PEN), polycarbonate (PC), polymethyl methacrylate (PMMA), polyetherimide (PEI), polydimethylsiloxane (PDMS), polyethylene (PE), polyvinyl alcohol (PVA), polystyrene (PS), biaxially oriented polystyrene (BOPS), acrylic resin, silicone resin, fluorine resin, and modified epoxy resin.

Further, the ceramic may be one or more of boron nitride (BN), alumina, aluminum nitride (AlN), and beryllium oxide (BeO).

However, the substrate including the first material is not limited to the above, and is capable of being variously changed according to the application purpose. For example, the substrate may be glass, a polymer film, a silicon wafer, a sapphire wafer, or a PCB substrate, and one or more materials of $Al_2O_3$, $Y_2O_3$, MgO, LMO, STO, $ZrO_2$, $CeO_2$, YSZ, and $HfO_2$, which may be used as a buffer layer of a superconducting wire, may be applied to the substrate.

Further, another aspect of the present disclosure relates to a method of manufacturing the thin film having single crystallinity. Specifically, the method includes preparing a substrate including a polycrystalline first material, and forming the thin film by depositing a polycrystalline second material on an upper portion of the substrate. The forming the thin film includes performing depositing so that crystals having a size lager than a size of crystal grains of the substrate are formed and crystal orientation is performed in parallel with an average direction of orientation axes of the crystal grains of the substrate, thus forming the thin film having excellent crystal orientation properties of crystal grains.

Preferably, in the step of forming the thin film, when the polycrystalline second material is deposited on the upper portion of the substrate, crystal nuclei are formed and crystals are epitaxially grown to form the thin film. The crystal orientation property of the thin film is controlled in a lowest energy state when the crystal nuclei are formed. Therefore, the single-crystal-level crystal orientation property is ensured almost at the same time as the second material is deposited, thereby satisfying Relational Expression 1 and Relational Expression 2.

As the deposition method, chemical vapor deposition (CVD), physical vapor deposition (PVD), atomic layer deposition (ALD), spin-on-glass (SOG), plating, and other various methods may be used. Preferably, in the step of forming the thin film, a CVD method using heat or plasma or a PVD method using thermal evaporation, electron beam, or sputtering may be used to form the thin film by vacuum deposition for the purpose of controlling the tissue of the thin film and improving the crystal orientation property.

In this regard, FIG. 7 shows the crystal orientation ability according to the deposition rate of a second material in a step of forming a thin film by depositing the second material using a thermal evaporation deposition method according to a preferable embodiment of the present disclosure. That is, in the present disclosure in which the cases when the deposition rate of the second material is fast and slow are shown in FIG. 7, the crystal orientation ability according to the deposition rate of the second material is shown as the result of Phi Scan analysis. However, the peaks at 0°, 90°, 180°, and 270° show that the average of the full width at half maximum of the substrate of the first material including MgO(220) grown in a forward direction is 6.8°.

Figure 7A:
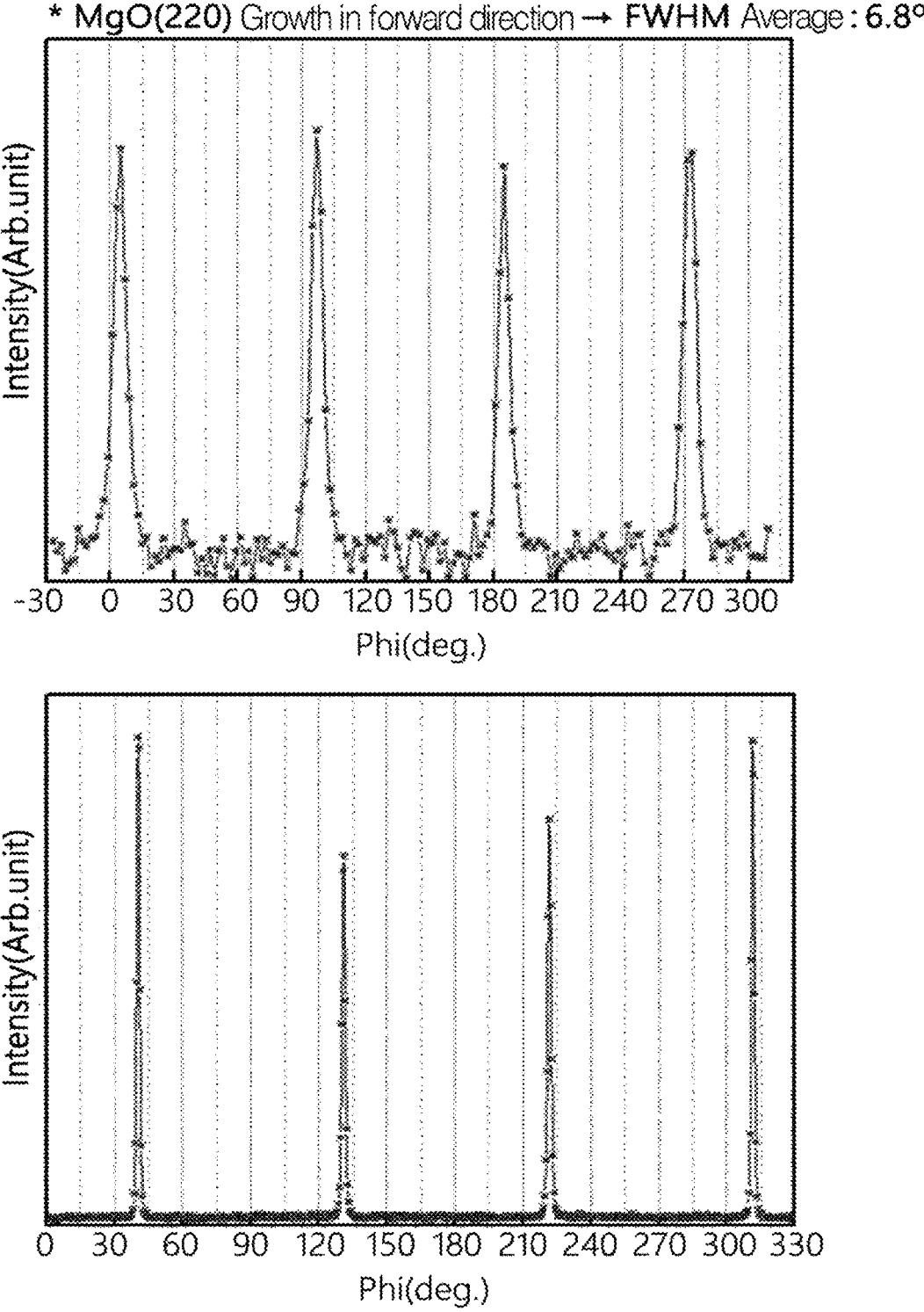
FIGS. 7A to 7C show the crystal orientation ability according to the deposition rate of a second material in a step of forming a thin film by depositing the second material using a thermal evaporation deposition method according to an embodiment of the present disclosure.
Figure 7B:
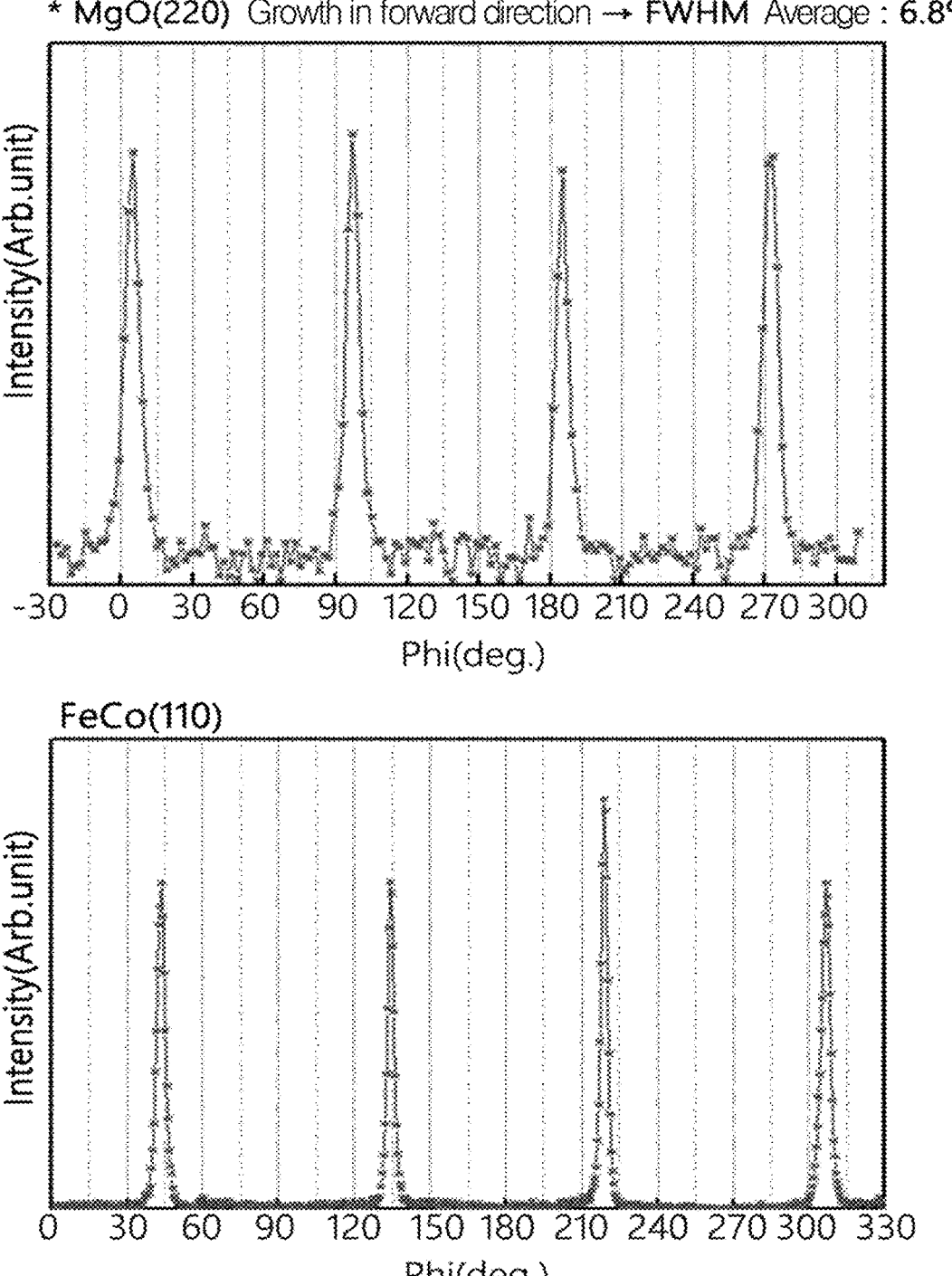
Figure 7C:
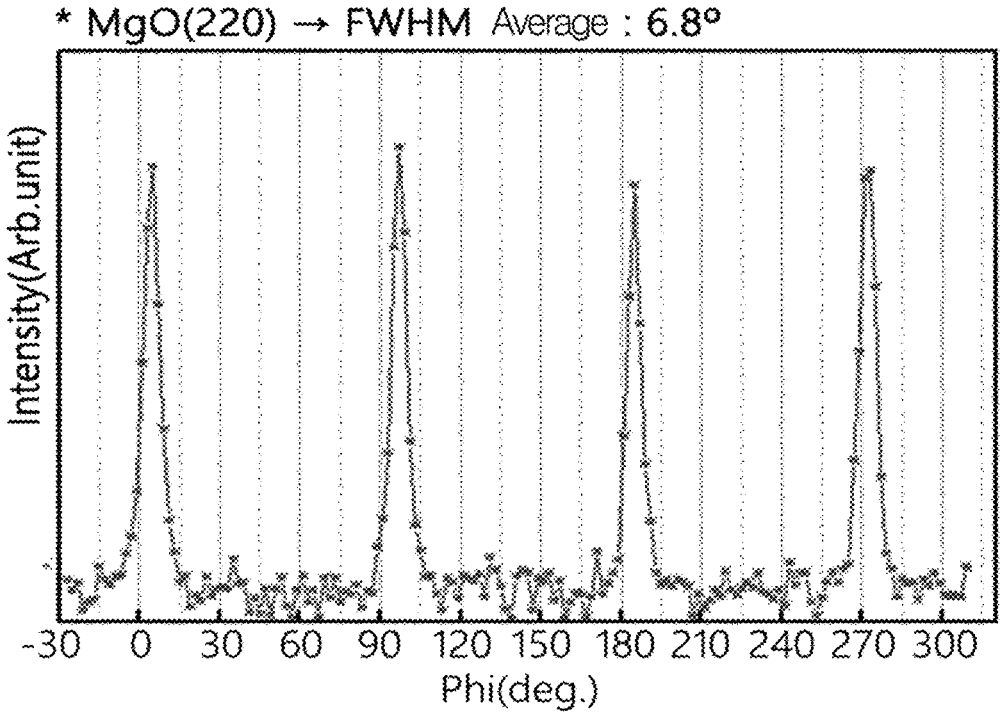
Figure 7C:
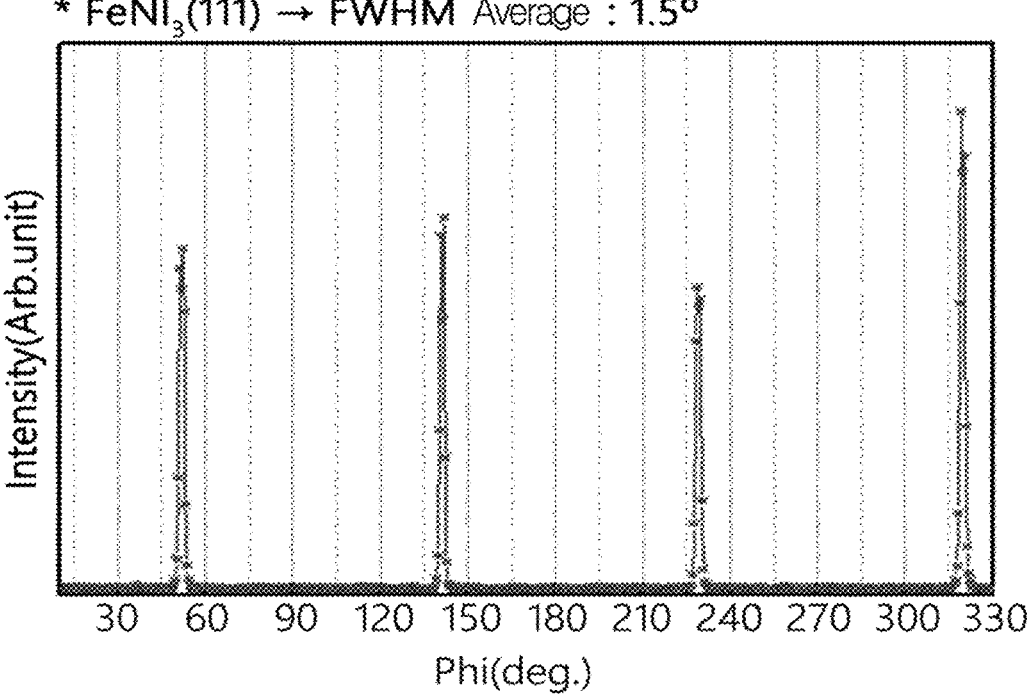
Figure 8A:
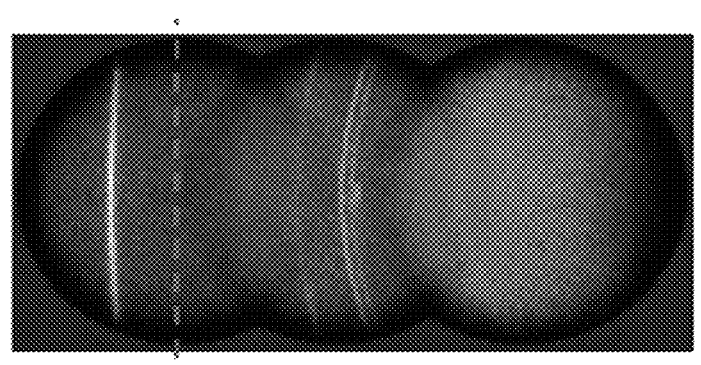
FIGS. 8A to 8H show the crystal orientation ability according to a deposition temperature in a step of forming a thin film by depositing the second material using a thermal evaporation deposition method according to an embodiment of the present disclosure.
Figure 8B:
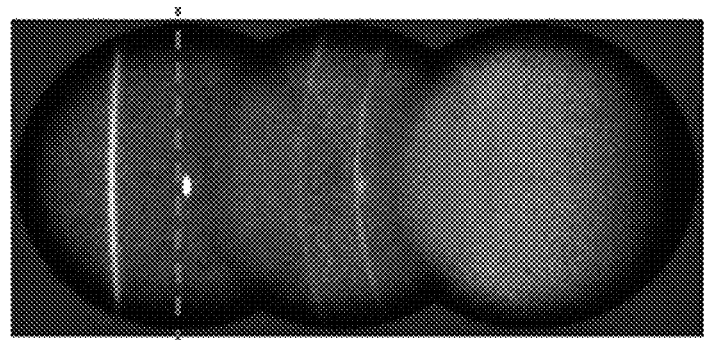
Figure 8C:
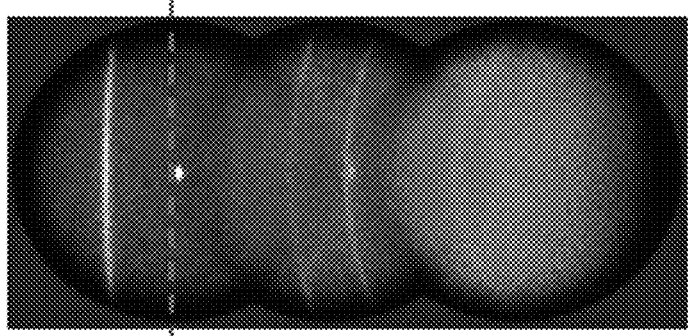
Figure 8D:
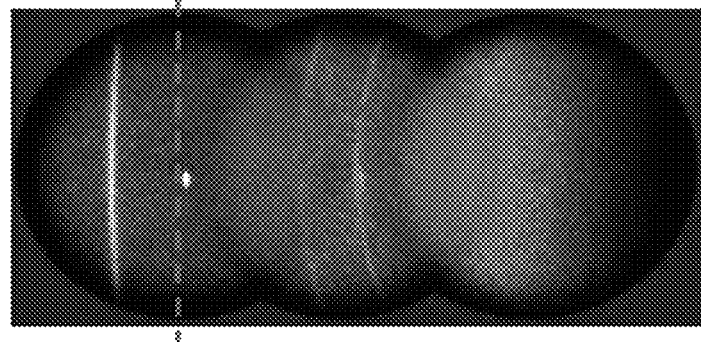
Figure 8E:
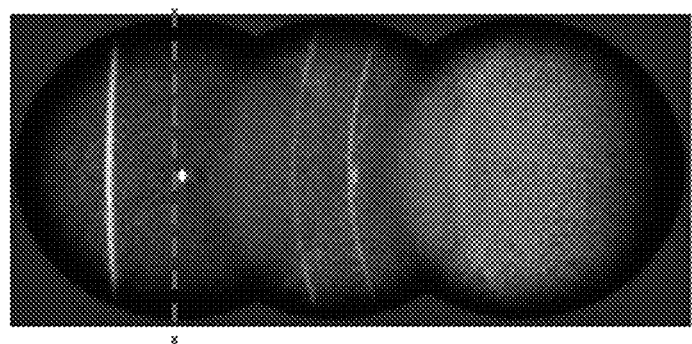
Figure 8F:
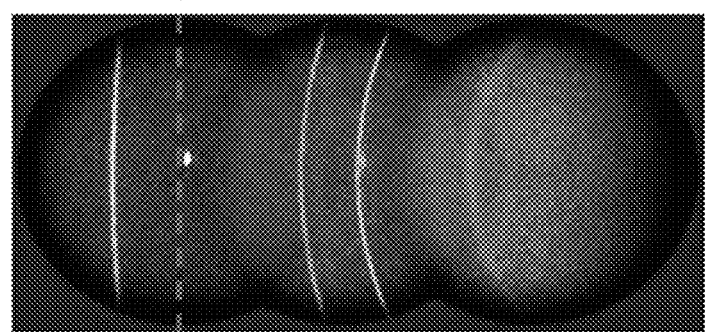
Figure 8G:
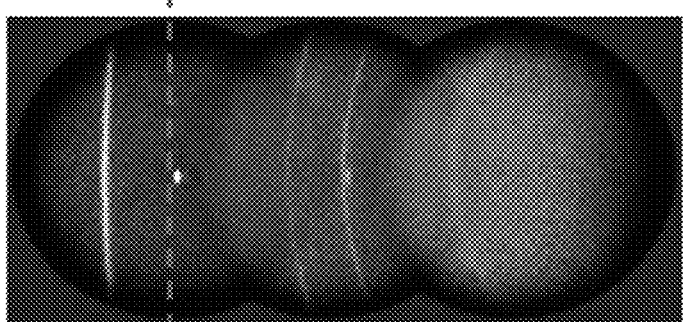
Figure 8H:
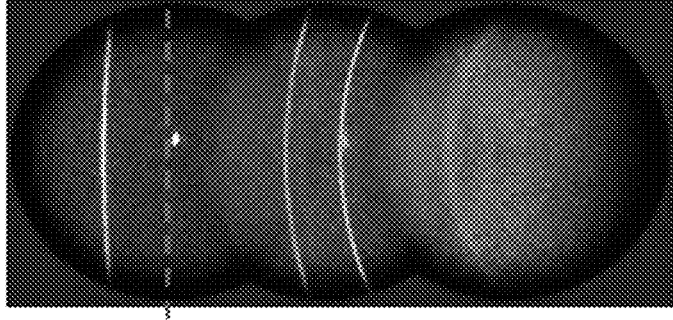

Referring to this, in FIG. 7A, through the peaks at 45°, 135°, 225°, and 315°, it is found that the average of the full width at half maximum of the thin film including the second material including a FeCo(110) alloy grown in a direction of 45° is 1.5°. In this case, the deposition rate is 40 Å/sec. Further, in FIG. 7B, the peaks at 45°, 135°, 225°, and 315° show that the average of the full width at half maximum of the thin film including the second material including a FeCo(110) alloy grown in a direction of 45° is 3.5°. In this case, the deposition rate is a deposition rate that starts from 0, which is a deposition starting point, and is increased by 40 Å/sec. Further, in FIG. 7C, through the peaks around 45°, 135°, 225°, and 315°, it is found that the average of the full width at half maximum of the thin film including the second material including $FeNi_3(111)$ grown in a direction of 45° is 1.5°. In this case, the deposition rate is 40 Å/sec.

From the result of FIG. 7, it can be confirmed that when the deposition rate is high, since the crystal nuclei are rapidly formed and the crystals are rapidly grown, the size of the crystal grain is increased, thereby increasing the crystal orientation property, and that when the deposition rate is low, since the crystal nuclei are relatively slowly formed and the crystals are relatively slowly grown, the size of the crystal grain is reduced, thereby reducing the crystal orientation property. Therefore, the crystal orientation property is increased as the deposition rate is increased. Further, since the Fe-based material as the second material has a body-centered cubic structure, when the crystal nucleus located at the center of each crystal is oriented parallel to the average direction of the orientation axes of the crystal grains of the substrate and when the deposition is performed at a high deposition rate, the crystal orientation property is increased.

Further, FIG. 8 shows the crystal orientation ability according to a deposition temperature in a step of forming a thin film by depositing the second material using a thermal evaporation deposition method according to a preferable embodiment of the present disclosure, and also shows the result of confirming the crystal orientation ability of the FeCo thin film according to the deposition temperature using a FeCo(002) peak. That is, FIGS. 8A to 8H show the XRD results of the thin film of the FeCo alloy which is the second material when the temperature of the substrate including the first material is 150° C., 200° C., 300° C., 400° C., 500° C., 600° C., 700° C., and 800° C. Referring to this, FeCo is amorphous when the temperature of the substrate is 150° C., and crystal orientation occurs from 200° C., thus achieving crystallization. It can be confirmed that the crystal orientation is performed from 200° C. and also is performed even at 800° C.

Therefore, in the step of forming the thin film including the Fe-based second material, the deposition may be performed preferably at at least 200° C. and more preferably at 500 to 600° C. The deposition at a high temperature of 700° C. or higher is required when a typical metal thin film is formed, but in contrast, it can be confirmed that crystal orientation ability is very high when a thin film is formed especially using a Fe-based second material.

As described above, according to the method of manufacturing the thin film having single crystallinity of the present disclosure, in the step of forming the thin film by depositing the polycrystalline second material on the upper portion of the substrate, it is possible to ensure a high crystal orientation property at a single crystal level by controlling the deposition temperature and the deposition rate.

Figure 9:
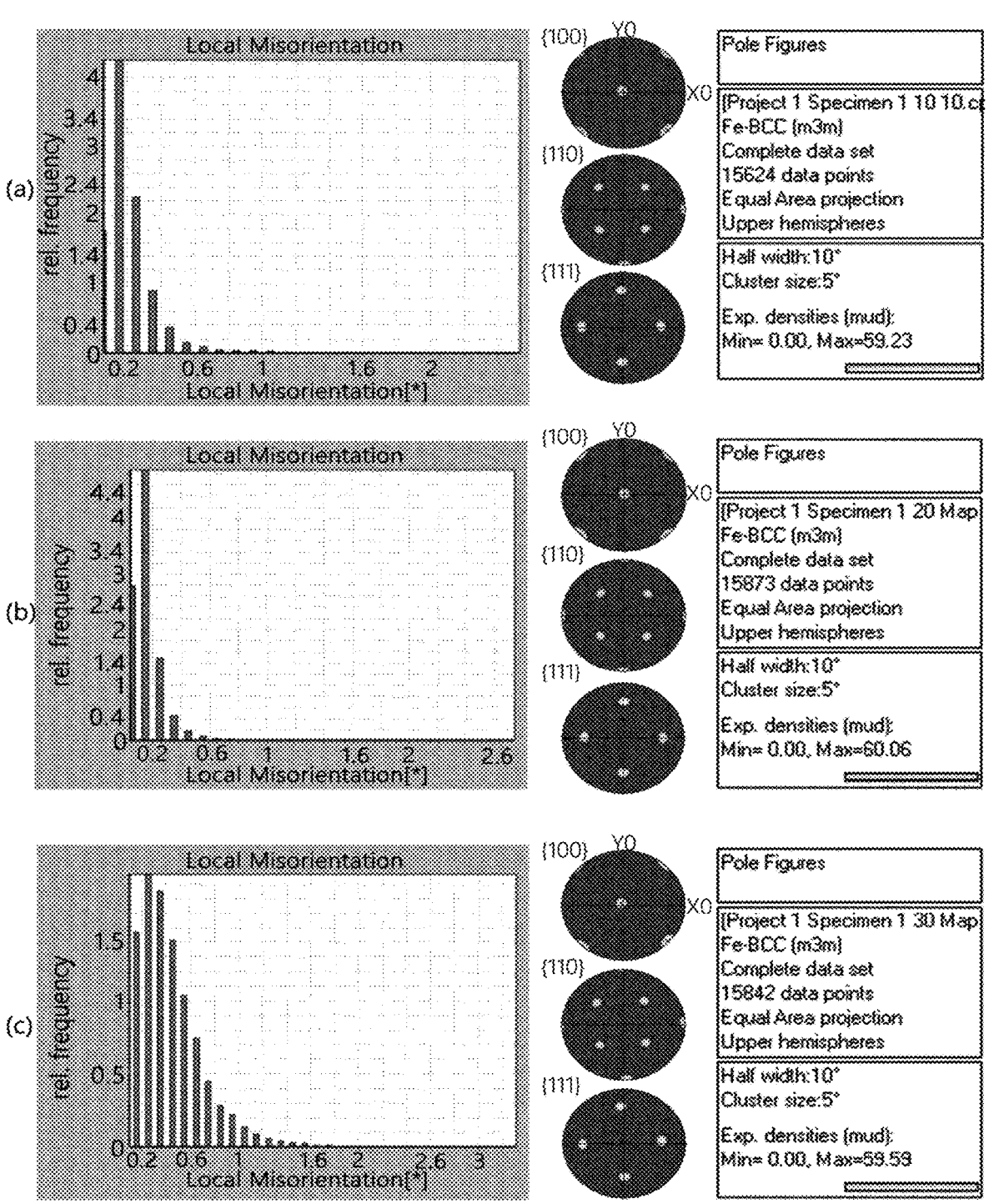
FIG. 9 shows the experimental results for the thickness indicating a single-crystal-level crystal orientation property.

Further, FIG. 9 shows the experimental results for the thickness indicating the single-crystal-level crystal orientation property, and also shows a crystal orientation time point in deposition according to the thickness of the FeCo alloy among the Fe alloys as the second material. That is, when a FeCo thin film is deposited in a thickness of (a) 40 nm, (b) 80 nm, and (c) 120 nm on the substrate, alignment is spontaneously performed so that the Fe(110) crystal plane direction distribution is within 0.5° almost at the same time as the deposition, thus exhibiting a single-crystal-level crystal orientation property.

Therefore, according to the method of manufacturing the thin film having single crystallinity of the present disclosure, the deposition is performed so that crystal orientation is achieved in parallel with the average direction of the orientation axes of the crystal grains of the substrate in an area ranging from the interface with the substrate including the first material to a depth of tens of nm. More preferably, the thin film having single crystallinity of the present disclosure exhibits the single crystallinity satisfying Relational Expression 1 in an area ranging from the interface with the substrate formed on the lower portion of the thin film to a depth of 40 nm or less.

Further, another aspect of the present disclosure may provide a semiconductor device and a battery device, such as a lithium secondary battery, a fuel battery, and a solar battery, which include the thin film having single crystallinity of the present disclosure.

Another aspect of the present disclosure may provide a superconducting wire, to which the thin film having single crystallinity of the present disclosure is applied, or a superconducting article including the same.

Figure 10:
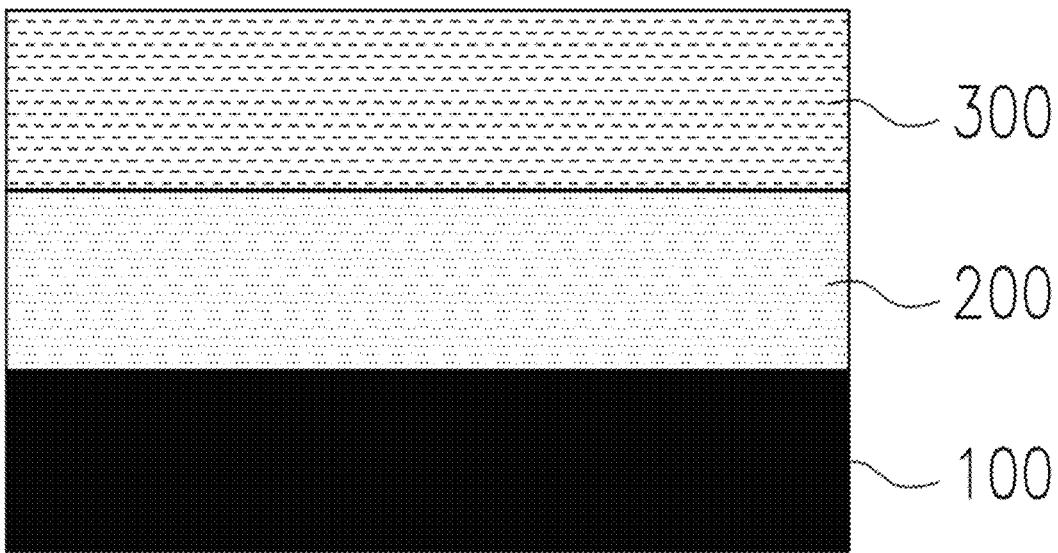
FIG. 10 shows the cross section of a superconducting wire to which the thin film having single crystallinity of the present disclosure is applied.

In this regard, FIG. 10 shows the cross section of a superconducting wire to which the thin film having single crystallinity of the present disclosure is applied. Referring to this, the superconducting wire to which the thin film having single crystallinity of the present disclosure is applied includes a substrate layer 100, a thin film layer having single crystallinity 200, and a superconducting layer 300.

Preferably, the substrate layer 100 is formed of a single layer or a plurality of layers including one or more of a metal, a metal alloy, a metal oxide, a polymer, and a ceramic. The thin film layer having single crystallinity 200 may be formed of a single layer or a plurality of layers, and the thin film having single crystallinity of the present disclosure may be applied thereto. Preferably, the thin film having single crystallinity may include Fe, a Fe alloy, or a Fe-based compound. The superconducting layer may be formed of a single layer or a plurality of layers of a superconducting body.

Hereinafter, an Example of the present disclosure will be described in more detail as follows. However, the following Examples are merely illustrative to aid in understanding of the present disclosure, and the scope of the present disclosure is not limited thereto.

First, a thin film material of a FeCo alloy including iron (Fe) and cobalt (Co) was formed. Specifically, after a metal substrate in which an $Al_2O_3$ layer, a $Y_2O_3$ layer, an MgO layer, and an LMO layer were sequentially layered on the upper portion of a Hastelloy layer was prepared, the metal substrate was disposed in a vacuum chamber, the vacuum chamber was pumped so that the degree of vacuum was $10^{-6}$ Torr or less, and the metal substrate was heated by radiant heat so that the temperature thereof became 600° C. A crucible including iron and cobalt mixed with each other was heated so that a deposition rate was at most 40 Å/sec, thereby increasing the deposition rate. Subsequently, the shutter of the crucible was opened to deposit iron and cobalt on the metal substrate. After the deposition was finished, the shutter was closed, and the metal substrate and the thin film of the FeCo alloy deposited thereon were naturally cooled.

A photograph of the formed FeCo thin film is shown in FIG. 3. FIG. 3A shows an SEM photograph of the surface of the thin film of the FeCo alloy. Referring to this, in the FeCo thin film, the FeCo crystal shape forms a rectangle, and the orientation axes thereof are straight and uniformly aligned. FIG. 3B shows a TEM photograph of the cross section of the thin film of the FeCo alloy. Referring to this, it can be confirmed that crystals thereof were epitaxially grown from the interface between the LMO layer and the thin film of the FeCo alloy. In particular, from FIG. 3B, it can be seen that the grain size at the grain boundary of the LMO layer is several to tens of nm and that the grain size at the grain boundary of the thin film of the FeCo alloy is at least two times as large as the grain size of the LMO layer from the interface between the LMO layer and the thin film of the FeCo alloy.

From the above-described results, the following can be confirmed: even when a difference in the full width at half maximum of the distribution curve of a misorientation angle at grain boundaries of the substrate including the first material and the thin film formed by depositing the second material in the present disclosure is more than 5°, the polycrystalline second material is deposited so that crystal orientation is achieved in parallel with the average direction of the orientation axes of the crystal grains of the substrate, so the full width at half maximum of the distribution curve of the misorientation angle at the grain boundary satisfies 3° or less, whereby it is possible to obtain a thin film having excellent crystal orientation properties of crystal grains.

In particular, in the case of some substrates, there is a case where the full width at half maximum of the distribution curve of the misorientation angle at the grain boundary is around 10°. In this case, since the misorientation angle is very large and thus a critical current density is significantly reduced, the substrates may not be suitable for use in a superconducting wire, so the substrates are treated as defective substrates. When the defective substrates are formed as described above, there is a problem in that the cost consumed in manufacturing the substrate is increased accordingly.

However, in the present disclosure, even when the full width at half maximum of the distribution curve of the misorientation angle at the grain boundary of the substrate is more than 10°, the polycrystalline second material in which the full width at half maximum of the distribution curve of the misorientation angle at the grain boundary is 3° or less is deposited on the upper portion of the substrate to form a thin film having single crystallinity. Accordingly, the above substrate may be used as it is, thereby reducing manufacturing costs.

As described above, when the full width at half maximum of the distribution curve of the misorientation angle at the grain boundary is reduced to 3° or less using the thin film having single crystallinity, it is possible to increase the critical current density of the superconducting wire by about 5 times compared to an existing superconducting wire. The use temperature of an existing superconducting application apparatus that is capable of being used only when reducing the temperature to 40K or less may be increased to 70K through such an increase in the critical current density. Thus, there is a merit in that the superconducting wire is capable of being present in a superconducting state even using a liquid nitrogen temperature.

Moreover, according to the present disclosure, particularly, it is possible to provide a thin film having single crystallinity and including Fe, a Fe alloy, or a Fe-based compound. Fe is the second most common metal in the earth's crust after aluminum and has the highest specific gravity among the elements constituting the earth. Therefore, the Fe-based thin film having single crystallinity serves to improve economic feasibility in terms of production costs and is excellent in crystal orientation property. The Fe-based thin film having single crystallinity may exhibit an excellent crystal orientation property regardless of the type of the first substrate including the polycrystalline first material, and thus is applicable to a flexible substrate and a large-area substrate. Accordingly, the Fe-based thin film having single crystallinity is expected to be able to impart excellent functions to a superconducting wire, a semiconductor device, and a battery device.

The above description is merely illustrative of the technical idea of the present disclosure, and various modifications and variations will be possible without departing from the essential characteristics of the present disclosure by those of ordinary skill in the art to which the present disclosure pertains.

Accordingly, the Examples disclosed in the present disclosure are not intended to limit the technical idea of the present disclosure, but are intended to be described, and the scope of the technical idea of the present disclosure is not limited by these Examples.

The scope of protection of the present disclosure should be construed by the claims, and all technical thoughts within the scope equivalent thereto should be construed as being included in the scope of the present disclosure.

What is claimed is:

1. A thin film comprising:
a substrate comprising a polycrystalline first material and a polycrystalline second material formed on an upper portion of the substrate,
wherein the thin film has a crystal orientation property satisfying a following Relational Expression 1 at a grain boundary:

$$0° < FWHM_2 \leq 3°; \qquad \text{[Relational Expression 1]}$$

wherein $FWHM_2$ is a full width at half maximum of a distribution curve of a misorientation angle at the grain boundary of the thin film,
wherein a size of a crystal grain of the second material formed in the thin film is at least two times as large as a size of a crystal grain of the substrate.

2. The thin film of claim 1, wherein the second material is Fe, a Fe alloy, or a Fe-based compound.

3. The thin film of claim 1, wherein a crystal orientation property of the substrate and the crystal orientation property of the thin film satisfy a following Relational Expression 2:

$$5° < FWHM_1 - FWHM_2 \leq 20°; \qquad \text{[Relational Expression 2]}$$

wherein $FWHM_1$ and $FWHM_2$ are a full width at half maximum of a distribution curve of a misorientation angle at a grain boundary of the substrate and at the grain boundary of the thin film, respectively.

4. The thin film of claim 1, wherein the first material is a crystalline solid.

5. A semiconductor device comprising:
the thin film of claim 1.

6. A battery device comprising:
the thin film of claim 1.

7. A superconducting wire comprising:
a thin film layer which is formed by depositing the thin film of claim 1 on an upper portion of the substrate; and
a superconducting layer formed on an upper portion of the thin film layer.

8. A superconducting article comprising:
the superconducting wire of claim 7.

\* \* \* \* \*